United States Patent [19]
Chen et al.

[11] Patent Number: 5,523,026
[45] Date of Patent: Jun. 4, 1996

[54] NONLINEAR OPTICAL (NLO) CRYSTAL STRONTIUM BERYLLATOBORATE $SR_2BE_2B_2O_7$

[76] Inventors: Chuangtian Chen; Baichang Wu; Yebin Wang; Wenrong Zeng; Linhua Yu, all of 123 Shantoujiao, Gulou District, Fuzhou Fujian, China, 350002; Qun Zou, Dep. Phys. Nanjing Uni., Nanjing Jianshu, China, 210093

[21] Appl. No.: 423,260

[22] Filed: Apr. 17, 1995

[30] Foreign Application Priority Data

Apr. 15, 1994 [CN] China ................ 94103759.2

[51] Int. Cl.6 ................ F21V 9/00; G02B 5/20; C01B 35/10
[52] U.S. Cl. ................ 252/582; 252/584; 423/277
[58] Field of Search ................ 423/277, 278, 423/279; 252/582, 584; 359/326, 328, 329; 385/122, 141

[56] References Cited

U.S. PATENT DOCUMENTS

| | | | |
|---|---|---|---|
| 4,493,819 | 1/1985 | Glass | 423/277 |
| 4,499,061 | 2/1985 | Glass | 423/277 |

OTHER PUBLICATIONS

Hong et al., Chemical Abstracts 122:119370, (1995).
Chen et al "Design and Synthesis of an Ultraviolet-Transparent Nonlinear Optical Crystal $Sr_2Be_2B_2O_7$" published on Jan. 26, 1995 by Letters to Nature.
Chen et al "A New-Type Ultraviolet SHG Crystal ... β... $BaB_2O_4$" published on Mar. 1985 by Scientia Sinica.
Chen et al. "Nonlinear Optics: Material, Fundamentals, and Applications" published on Aug. 17, 1992 by 1992 Technical Digest Series vol. 18.

*Primary Examiner*—Philip Tucker
*Attorney, Agent, or Firm*—Pennie & Edmonds

[57] ABSTRACT

The present invention relates to a new type NLO crystal Strontium Beryllatoborate (Chemical formula $Sr_2Be_2B_2O_7$, abbr. SBBO). The SBBO compound is synthesized by chemical reaction of solid state in high temperature sintering, Its chemical reaction equation is:

$$2SrCO_3+2BeO+2H_3BO_3 \rightarrow Sr_2Be_2B_2O_7+2CO_2\uparrow+3\,H_2O\uparrow$$

A flux method is applied to the growth of single crystal of Strontium Beryllatoborate, in which $SrB_2O_4$, NaF and other fluorides were used as flux solvents. The result of measurement indicated that this compound has following structural and physical characteristics: space group: $P6_3(C_6^6)$ point group: $C_6$, unit cell: a=4.663(3) Å, c=15.311(7) Å, z=2, V=283.3(Å)³. SBBO belongs to crystal of negative optical axis, its harmonic generation devices, optical parameter and amplifier devices and optic-wave guide devices in UV region will win wide application, the coherent light of wave length shorter than 200 nm can be produced through direct frequency-multiplication.

9 Claims, 5 Drawing Sheets

SBBO

NONLINEAR OPTICAL (NLO) CRYSTAL STRONTIUM BERYLLATOBORATE SR₂BE₂B₂O₇

This invention is concerned to a new type optico-electronic material, a completely new NLO crystal Strontium Beryllatoborate $Sr_2Be_2B_2O_7$ (abbr. SBBO). The so-called NLO effect is defined to such an effect of crystals, by which a frequency of a laser beam is undergone changed from the original to others, as shown in FIG. 1, when it passes through a crystal, with the polarization direction of the laser and the direction entering the crystal controlled.

BACKGROUND OF INVENTION

At present, there are two crystals which are distinguished in ultralviolet NLO(UV NLO) materials, one is $\beta$-$BaB_2O_4$ (C. T. Chen, B. C. Wu et al. Sci. Sin. B28,234(1985)), and the other $KBe_2BO_3F_2$ (abbr. KBBF) (C. T. Chen, B. C. Wu et al. Nonlinear Optics: Materials, Fundamentals and applications, MA7-1/19 Aug. 17–21, 1992, Hawaii, USA), both invented and developed by Prof. C. T. Chen's research group of Fujian Institute of Research on the Structure of Matter, Chinese Academy of Sciences). BBO crystal has a planar ($B_3O_6$) group as the basic structure unit, and therefore, there is a conjugate $\pi$ orbital of non-symmetry in the valent orbitals of the group that is the structural reason of why the group can produce a high microscopic second-order susceptibility. Meanwhile, the groups are spatially oriented in the crystal in such a manner that makes BBO possess very high macroscopic NLO effects. In fact, the $d_{22}$ coefficient, a major macroscopic NLO coefficient of BBO, is less than or equals to 2.7 pm/v, which is the highest in the ultraviolet NLO crystals found up to now. However, there are shortcomings for BBO as an UV NLO crystal. Of them, the main is the three of following:

(1) the band gap of the group is too narrow so that the absorption edge of the crystal is shifted toward the I.R. side of spectrum, reached to about 189 nm. When BBO is used to produce a harmonic generation output in range from 200 nm to 300 nm, therefore, the absorption factor is greatly enhanced, in comparison with the case when used in the visible range. It is why the crystal is so easy to be damaged when used to produce the fourth harmonic generation with high fundamental optical power. In addition, owing to the partial absorption of the quadruple frequency, the rise of temperature in the area of crystal subject to the light radiation is inhomogeneous, which leads to the local change of refractive index and greatly falling of optical quality of the harmonic generation output;

(2) Due to the limit of absorption edge, as stated above, it can not used to produce a harmonic generation output shorter than 193 nm;

(3) The birefringence of BBO $\Delta n \cong 0.12$, which is also related with the planar structure of $B_3O_6$ group arranged isolately in the crystal lattice. Such a larger birefringence of BBO makes the acceptance angle at the frequency of quadruple multiplication to be too small ($\Delta\theta=0.45$ mrad) to suit for device applications.

It was pointed out in our paper at the 1992 Hawaii meeting cited above, that it is possible to overcome the above shortcomings of BBO by replacing the active NLO group $B_3O_6$ with $BO_3$. It was further pointed out in the paper, that the three oxygen terminals of $BO_3$ should simultaneously become bridged ones to other atoms, if the compound with $BO_3$ as the basic structure unit remain the larger NLO effects of BBO, with absorption edge comparatively shifting toward the blue side of spectrum, in range 150 nm–160 nm. It is also possible for such a compound, in addition, to reduce the birefringence, which is a favor to increase acceptance angle of the crystal. Based on these theoretical considerations, we succeeded in development of a new type UV NLO crystal $KBe_2BO_3F_2$ (KBBF), whose absorption edge reaches at 155 nm, birefringence down to about 0.7, and the phase-matchable range extends to 185 nm, So KBBF, obviously, is ideal in the three respects of above. However KBBF is found very difficult to grow, because of too strong layer habit of the crystal lattice. And relative to this, the crystal appearance is similar to mica, with a severe cleavage at (001) plane of the lattice. These make a great difficulty for KBBF is found very difficult to grow, because of too strong layer habit of the crystal lattice. And relative to this, the crystal appearance is similar to mica, with a severe cleavage at (001) plane of the lattice. These make a great difficulty for KBBF to become a practical NLO crystal.

What the aim of this invention is concerned to is to invent a novel NLO crystal, which both overcome the shortcomings of BBO and KBBF, and maintains or even exceeds the merit of BBO with respect to SHG, This innovation, in particular, helps open up a new path for development of NLO crystals for applications of vacuum UV.

SUMMARY OF THE INVENTION

Based on the principles of the Anionic Group Theory for NLO effects of crystals (C. T. Chen, Y. Wu, and R, Li et al., Rev. Phys, Chem, Vol. 8, 65(1989)), and the above considerations, it is suggested that the ($BO_3$) groups are suited as the basic structural units, if the groups could contain a co-planar arrangement, with its three oxygen terminals co-sharing among the groups or with other groups, like the case of KBBF, and, besides, it is also needed to bring a covalent bond to strengthen the interaction between the layers, in order to overcome the layer habit of KBBF. Now we have designed mid synthesized a completely new boron-beryllium compound, and also succeeded in the growth of the crystals in larger size and high optical quality. This is so-called a completely new NLO crystal Strontium Beryllatoborate, the chemical formula $Sr_2Be_2B_2O_7$, abbreviated as SBBO. Structure determination shows the structure characteristics of SBBO, as shown in FIG. 2b, is quite satisfied in all the respects of design: the $BO_3$ groups are arranged together with $BeO_4$ groups in a co-planar manner to compose a $(B_3Be_3O_6)_\infty$ layer, so as to remove the three oxygen terminals, and additional oxygen atoms are brought as the fourth coordination of the beryllium atoms bridged between two nearest neighbor layers.

The SBBO compound was synthesized by following chemical reaction of solid state (ref. to example 1 for detailed technology of synthesis):

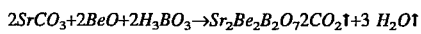

$$2SrCO_3 + 2BeO + 2H_3BO_3 \rightarrow Sr_2Be_2B_2O_7 2CO_2\uparrow + 3\ H_2O\uparrow$$

The SHG measurement of the powder sample obtained from the above reaction showed the SHG effects are 3 to 4 times higher than that of powder sample of KDP. We further selected a top-seeding high temperature flux method for the crystal growth of SBBO, in which $SrB_2O_4$, NaF and other fluorides were used as flux solvents, platinum crucible as container, and resistance furnace to heat, and DWK-702 to control temperature individually. By this method we have succeeded in growing the single crystal of SBBO. The

3 results of structure determination of the single crystal are as follows: Space Group $P6_3(C_6^6)$ (point group: $C_6$), Unit Cell: $a=4.663(3)$ Å, $c=15.311(7)$ Å, $z=2, V=283.3$Å$^3$, and the crystal structure is shown in FIG. 2a, 2b. There are two main structural characteristics in the SBBO crystal lattice that are clearly demonstrated in the figures:

(1) There exists a network layer structure that composes of $BO_3$ and $BeO_4$ group extended infinitely along the xy plane of the crystal. The atoms of $BO_3$ group, and $BeO_3$ atoms from the $BeO_4$ group are arranged in a nearly co-planar manner. In this way the three oxygen terminals of the $BO_3$ group are turned to become bridged ones to the nearest three neighbor of beryllium atom. That basically satisfies our requirements of the group design to keep a layer structure like KBBF, which therefore, make sure of large SHG effects of the crystal, and extension of the absorption edge toward about 150~160 nm.

(2) There are oxygen atoms bridged within each pair of the layers, which belong to the out-layer coordination of the beryllium. This satisfies another important requirement of our design, which make sure of not strong layer habit of the crystal, and the better mechanical properties.

The theoretically predicted NLO properties of SBBO have been well confirmed by the optical experiment measurements. They showed that the cut-off wave length in UV side teaches $\lambda=155$ nm. And the crystal belongs to negative optical axis ones, and the birefringence is equal to 0.06, when laser wave length $\lambda=5893$Å. According to point group $C_6$ that SBBO belongs to, there is only one SHG effect $d_{22}$ that needs to be determined. The formula of the effective SHG coefficients, $d_{eff}$, for SBBO, is represented as: $d_{eff}=d_{22} \cos\theta\sin3\phi$. Where $\theta$ is an angle between the optical axis (i.e. the z axis ot the 3-hold symmetrical axis of the crystal ) and the direction laser enters to. We have preliminary measured the deft, using phase-matching method and $d_{22}$ of BBO crystal, as standard. The results is: $d_{22}=(1\sim1.22)\times d_{22}$ (BBO). We have further measured the phase-matching range of SBBO, and recognized that SBBO can achieve SHG output from 1800 nm to 200 nm at least. In addition, the hardness of SBBO is about 7 Morse, the melting point is higher than 1400° C., and it is not deliquescent possessing better mechanical properties.

As to the merits of the most importance of SBBO crystal now we may make a summary as below:

(1) It overcomes, to a great extent. the strong layer habit, and appears no apparent plane of cleavage, and has better mechanical properties, in comparison with KBBF;

(2) The density of the active groups $BO_3$ in SBBO lattice is two times larger than that in KBBF, and, therefore, the SHG coefficient is about two times higher than KBBF.

(3) It also overcomes shortcomings of BBO in many respects of NLO properties, such as absorption edge, birefringence, and phase-matchable range as well, while remains the SHG coefficient as same as BBO.

So it is perspective that SBBO crystal will win a broad field of NLO applications. It has a great potential to replace BBO crystal in many applications, such as data storage, sub-micron photolithography for high-density semiconductor device fabrications, laser chemistry (especially molecule splicing), laser spectroscopes, harmonic generation devices, and optic-parameter and amplifier devices as well. It will, in particular, open up NLO applications in vacuum UV range.

4

DETAILED DESCRIPTION OF THE PREFERRED ENBODIMENTS OF THE INVENTION

BRIEF DESCRIPTION OF THE DRAWINGS

FIG. 2a. the layer arrangement of SBBO (projection along x axis);

FIG. 2b. projection of a $(B_3Be_3O_6)_\infty$ co-planar network layer along z axis ●-cation $B^{3+}$; O-anion $O^{2-}$; 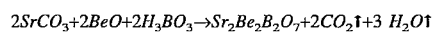-cation $Be^{2+}$ FIG. 3a. x-ray diffraction spectrum of SBBO powder from solid synthesis; FIG. 3b. x-ray diffraction spectrum of SBBO single crystal powder;

II. Three typical examples to perform the invention:

1) Example 1: In synthesis of SBBO, a solid reaction of sintering under temperature 950° C. was applied, the formula of chemical reaction being as follows:

$$2SrCO_3+2BeO+2H_3BO_3 \rightarrow Sr_2Be_2B_2O_7+2CO_2\uparrow+3\ H_2O\uparrow$$

The chemical purity of the chemicals and the manufacturers of the products:

$SrCO_3$: Ar, The Beijing Chemical Plant, purity: >99.0%; BeO: Ar, The Shanghai Xi-zhi Chemical Plant, purity: >99.5%; $H_3BO_3$: Ar, The Yun-ling Chemical Plant, purity: >99.5%.

The quantity of the three chemicals used in the reaction:

$SrCO_3$: 29.53 g (0.2 mole); BeO: 5.00 g (0.2 mole); $H_3BO_3$: 12.37 g (0.2 mole).

Figure 3A:
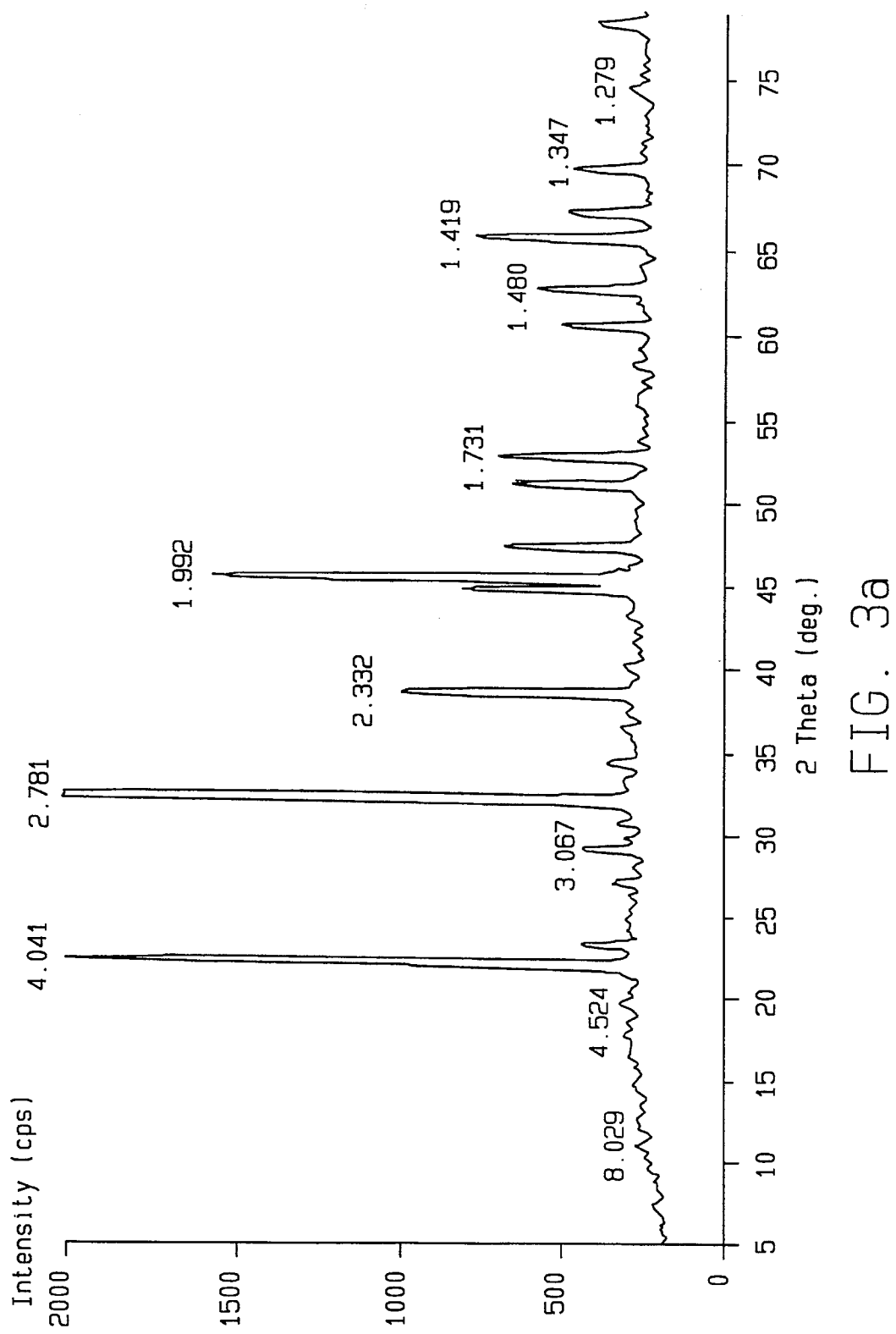
FIG. 3a and 3b: x-ray diffraction spectrum of SBBO.

The operation steps for the reaction:

Take $SrCO_3$(29.53 g), BeO(5.00 g) and $H_3BO_3$ (12.37 g), exactly in mole ratio of 1:1:1, into a mortar to mix and grind carefully in the operation room. Then the homogeneous mixture ground Take $SrCO_3$(29.53 g), BeO(5.00 g) and $H_3BO_3$(12.37 g), exactly in mole ratio of 1:1:1, into a mortar to mix and grind carefully in the operation room. Then the homogeneous mixture ground is placed into a crucible with size of Φ60×60 mm, and pressed firmly after the charge with a bowl. And the crucible covered is moved into a furnace to heat slowly to 950° C. and to sinter for two days. After cooling, the sample from the crucible which is quite loose is placed into a mortar to grind again and then turned back to the crucible. The latter, then, is put in the furnace again for another sintering under 950° C. for two days. The sample after the above process now is sintered into a firm form, which is the product of SBBO. The x-ray powder diffraction spectrum of the product is shown in FIG. 3a.

Figure 3B:
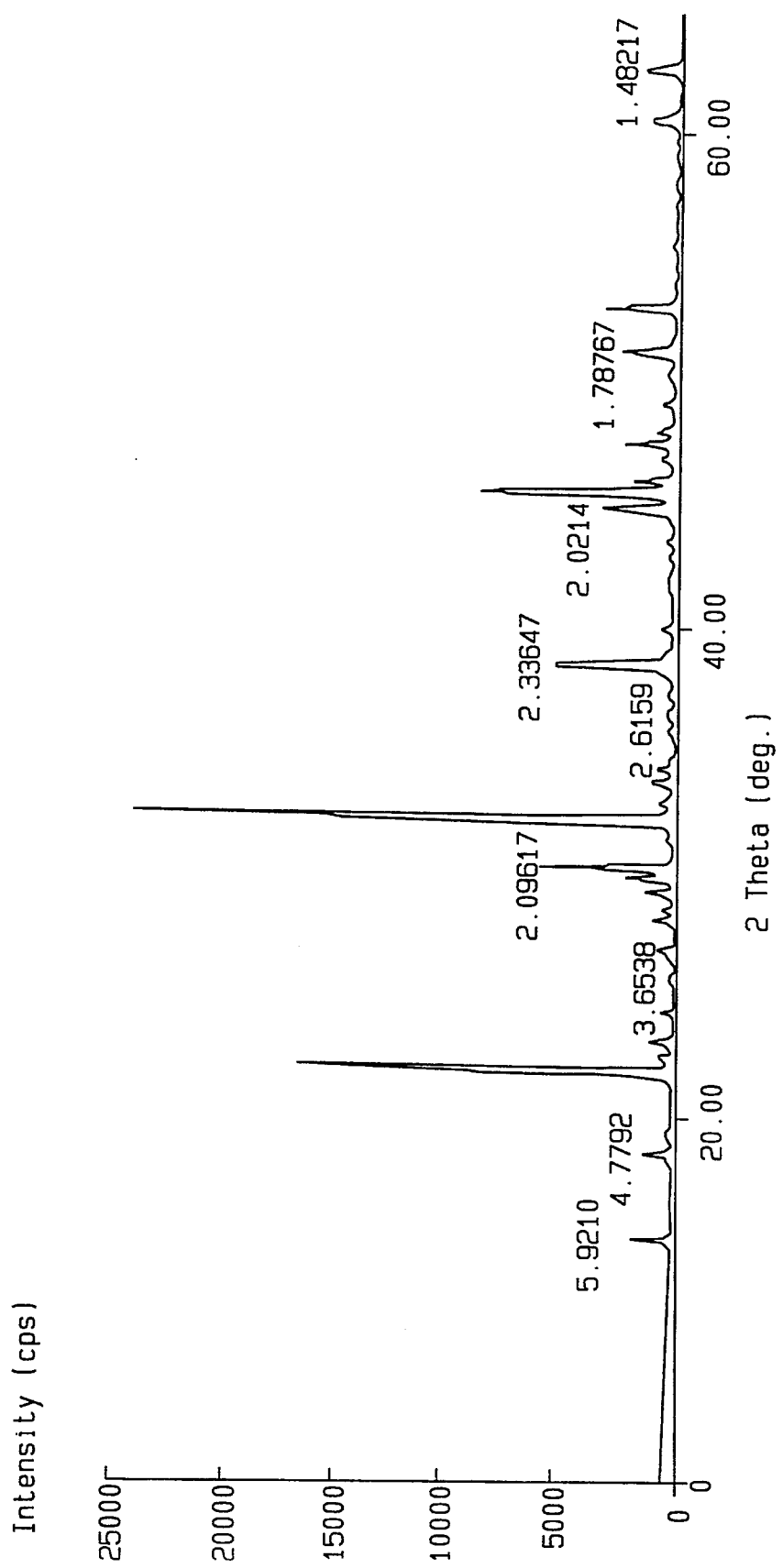

2) Example 2: A flux method is applied to the growth of single crystal of SBBO The self-made resistance furnace is controlled with DWK-702 unit. The operation process is as below:

The analytical-purified NaF and $Sr_2B_2O_4$ which is self-synthesized are selected as fluxes. They are treated together with the SBBO product obtained from above, in a mole ratio of following: NaF: $SrB_2O_4$:SBBO=0.55:0.45:0.45×35/65, the treated sample then is placed into a crucible container with size of 40×40 mm, and the latter then put into a growth furnace self-made to rise temperature up to 1000° C., to make the starting material melted, and thermostatically kept for about 1 hour. After decreasing the temperature to 800° C. with a falling speed of 10° C. per day, the SBBO single crystal is obtained with size of 7×5×2 mm$^3$. THE X-RAY DIFFRACTION SPECTRUM OF SBBO SINGLE CRYSTAL IS SHOWN IN FIG. 3$b$.

Figure 1:
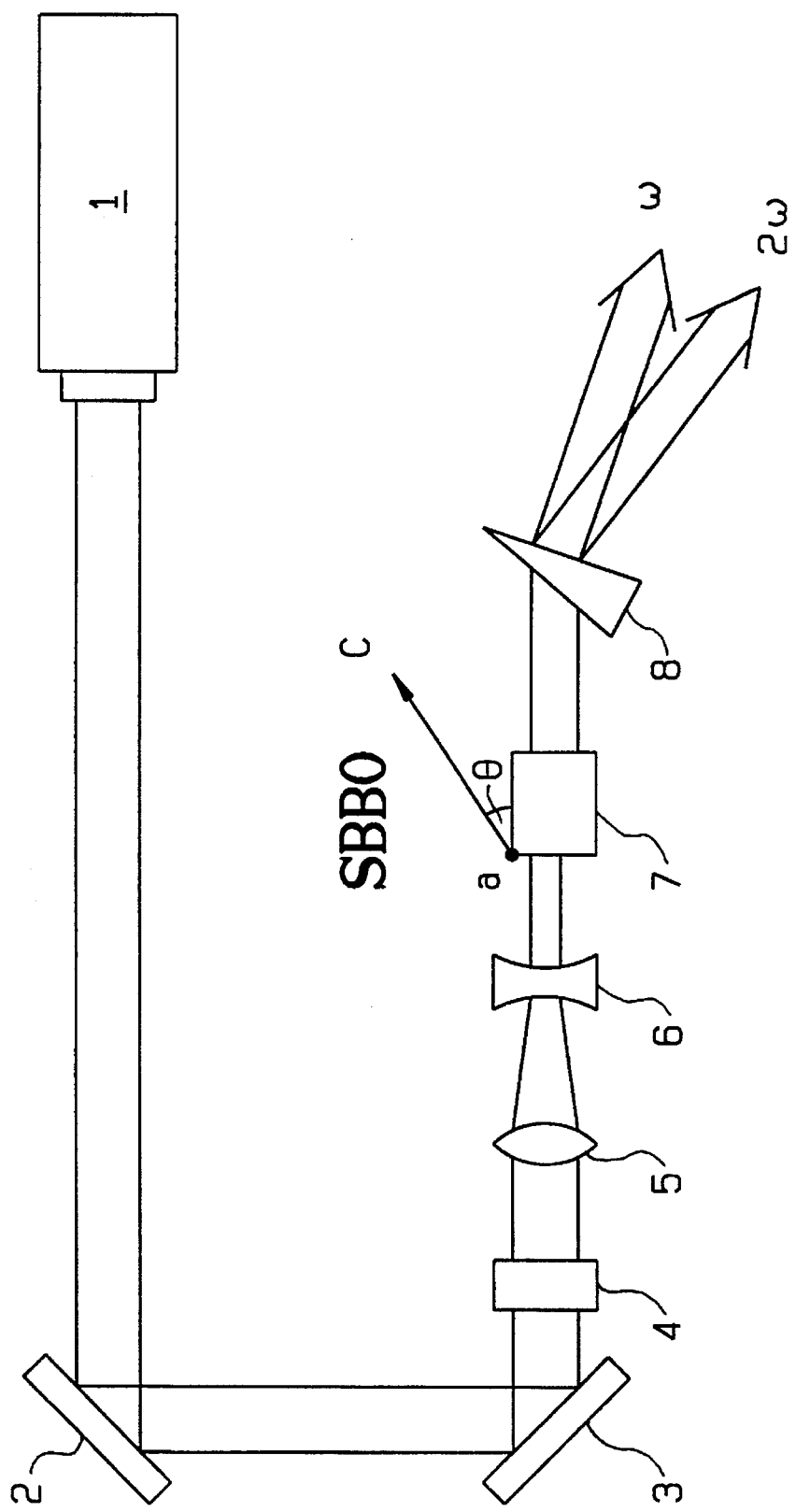
FIG. 1: A typical schedule performing SBBO as a SHG crystal to show the NLO effect: (1) laser; (2)–(3)mirrors; (4) a ½ λ plate; (5)–(6) lenses; (7) SBBO crystal, both a and c are one of crystal axes, θ the angle of phase-matching; (8) a dispersion prism, ω and 2ω are basic wave frequency and SHG frequency, respectively.
Figure 2A:
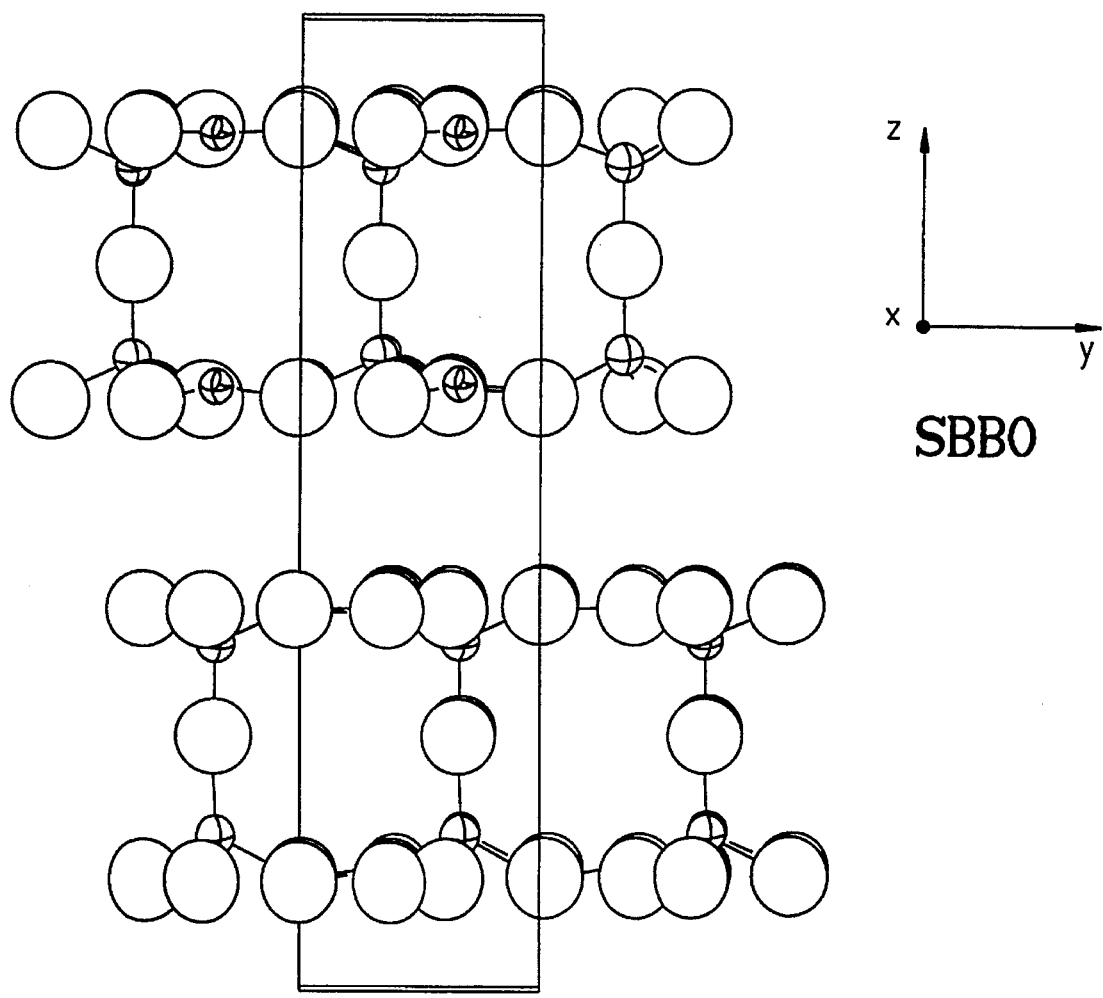
FIG. 2a and 2b: Crystal structure of SBBO.
Figure 2B:
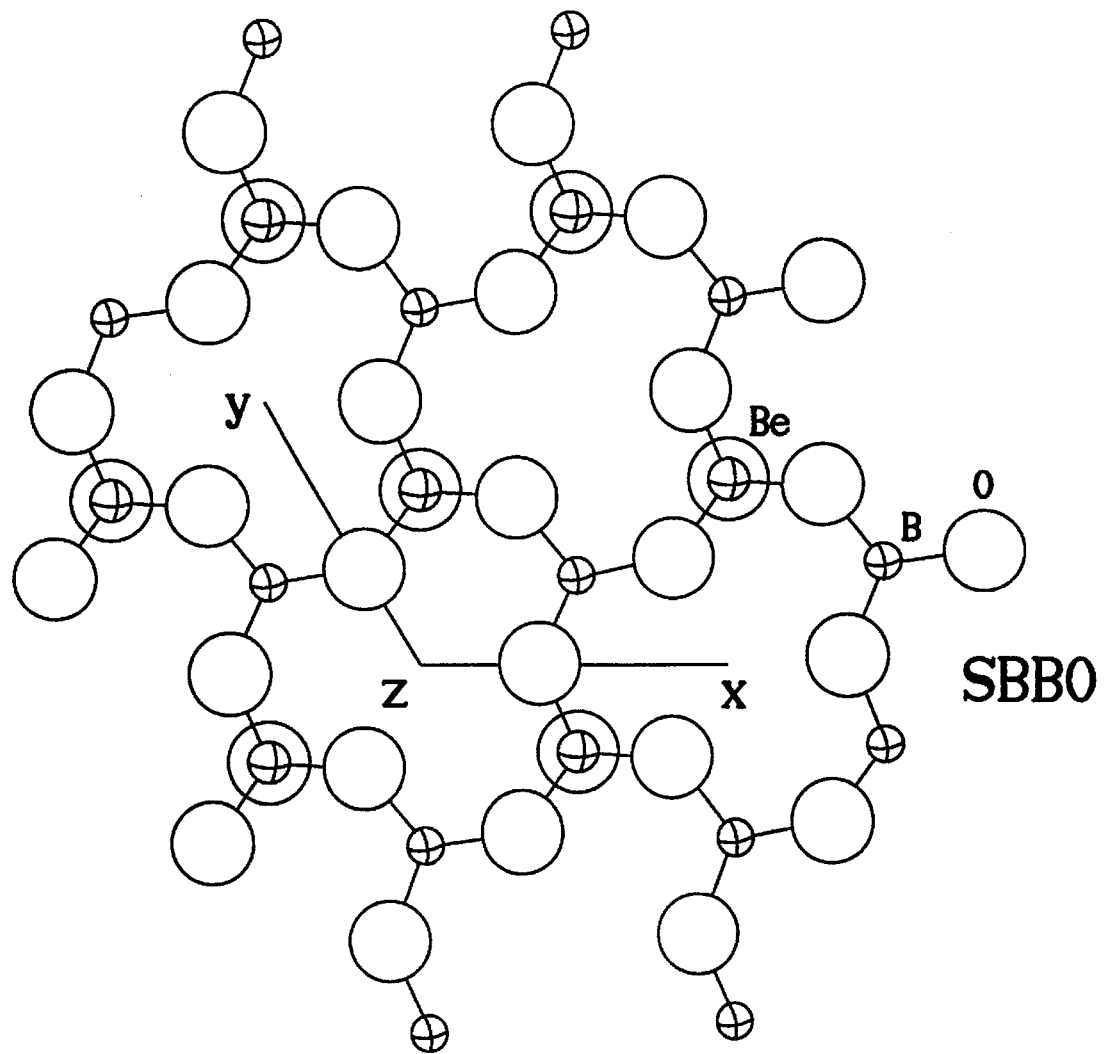

3) Example 3: SBBO single crystal is applied to SHG application, the process of which is shown typically in FIG. 1. The laser (1), as shown in the figure, emits basic wave light of laser with a certain length of the wave. The polarization direction of the emitted laser beam is modulated, through the ½ λ plate(4), to become parallel to the a axis of the crystal. Thus, the basic wave light is transported through the SBBO crystal, with transportation direction crossed to the c axis of the crystal with angle θ, which is so-called phase-matching angle. The value of the phase-matching angle is determined by the wave length of the laser beam. For example, SBBO's phase-matching angle θ=20° C., when the wave length of the laser λ=1.06 μm. When the laser beam passes through the SBBO crystal (7), the light beam issued out from the SBBO crystal contains simultaneously both the basic wave light and the second order harmonic generation output, with the frequency ω and 2ω respectively. The purified SHG output can be obtained through the dispersion prism(8).

The said example is only a simplest application of SBBO in NLO. The SBBO crystal can also be used to perform sum-frequency or difference-frequency output. When two beams of laser with frequency ω1 and ω2 pass through the SBBO crystal, with a certain polarization direction and entering direction, two kind of beam in frequency ω1+ω2 and ω1−ω2 can be obtained. In addition, when a pumped laser light passes through the SBBO crystal, in help of optical parameter resonator or optical parameter amplifier, a beam of laser whose frequency is continuously modulated can also be obtained.

What is claimed is:

1. A composition comprising $Sr_2Be_2B_2O_7$ for use in a non-linear optics application.

2. A compound of formula $Sr_2Be_2B_2O_7$.

3. A compound according to claim 2 of hardness about 7 Morse and melting point approximately 1400° C.

4. A compound according to claim 2 having a unit cell of hexagonal symmetry having a unit cell constant a approximately equal to 4.7 Å and a unit cell constant c approximately equal to 15.3 Å.

5. A compound according to claim 2 made by a flux method in which the flux solvents comprise $SrB_2O_4$ and NaF.

6. A compound according to claim 2 which can achieve second harmonic generation (SHG) from 1800 nm to 200 nm for a laser beam of wavelength λ=1.06 μm.

7. A compound according to claim 2 which can produce some harmonic wave output shorter than 200 nm.

8. A compound comprising $Sr_2Be_2B_2O_7$ for use in harmonic generation devices, optical parameter devices, optical amplifier devices and optical wave guide devices in the UV region.

9. A method for making the compound $Sr_2Be_2B_2O_7$ using a flux method with flux solvents including $SrB_2O_4$ and NaF.

* * * * *